(12) United States Patent
Maruyama

(10) Patent No.: US 6,433,563 B1
(45) Date of Patent: Aug. 13, 2002

(54) PROBE CARD WITH RIGID BASE HAVING APERTURES FOR TESTING SEMICONDUCTOR DEVICE, AND SEMICONDUCTOR DEVICE TEST METHOD USING PROBE CARD

(75) Inventor: Shigeyuki Maruyama, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/417,706

(22) Filed: Oct. 13, 1999

(30) Foreign Application Priority Data

Apr. 16, 1999 (JP) .............................. 11-110061

(51) Int. Cl.[7] .............................................. G01R 31/02
(52) U.S. Cl. ........................ 324/754; 324/758; 324/760
(58) Field of Search ................................ 324/754, 758, 324/760

(56) References Cited

U.S. PATENT DOCUMENTS

| | | | | |
|---|---|---|---|---|
| 5,177,439 A | * | 1/1993 | Liu et al. ..................... | 324/754 |
| 5,203,725 A | * | 4/1993 | Brunker et al. .............. | 439/636 |
| 5,225,037 A | * | 7/1993 | Elder et al. .................. | 216/18 |
| 5,239,260 A | * | 8/1993 | Widder et al. ............... | 324/758 |
| 5,555,422 A | * | 9/1996 | Nakano ....................... | 324/754 |
| 5,559,446 A | * | 9/1996 | Sano ........................... | 324/760 |
| 5,945,834 A | * | 8/1999 | Nakata et al. ............... | 324/754 |
| 5,982,183 A | * | 11/1999 | Sano ........................... | 324/754 |
| 6,005,401 A | * | 12/1999 | Nakata et al. ............... | 324/754 |

OTHER PUBLICATIONS

Leslie Et Al., Membrane Probe Card Technology, IEEE 1988 International Test Conference.*

* cited by examiner

*Primary Examiner*—N. Le
*Assistant Examiner*—Wasseem H. Hamdan
(74) *Attorney, Agent, or Firm*—Armstrong, Westerman & Hattori, LLP

(57) ABSTRACT

The present invention relates to the testing method of a probe card and semiconductor device to conduct the testing to each chip in the wafer condition where a plurality of chips and CSPs (Chip Size Packages) are formed. The probe card is characterized by including a flexible contact board, a plurality of contact electrode groups provided in a predetermined layout on the contact board, a rigid base provided on the contact board between the contact electrode groups to have an aperture to expose the contact board of the area where the contact electrode is formed and wiring provided on the contact board and connected to the contact electrode. The advantages of the probe card is that it can always attain good contact condition of each chip and electrode pad of CSP on the occasion of testing the chip and CSP in the wafer condition.

14 Claims, 22 Drawing Sheets

PROBE CARD WITH RIGID BASE HAVING APERTURES FOR TESTING SEMICONDUCTOR DEVICE, AND SEMICONDUCTOR DEVICE TEST METHOD USING PROBE CARD

CROSS-REFERENCE TO RELATED APPLICATIONS

This application is based upon and claims priority of Japanese Patent Application No. 11-110061, the contents being incorporated herein by reference.

BACKGROUND OF THE INVENTION

The present invention generally relates to a testing method of a probe card for simultaneously testing, in the wafer condition, a plurality of chips and chip size packages (hereinafter referred to as CSP) formed on the wafer and of semiconductor devices such as a wafer having formed chips or a wafer level CSP or the like.

A new type of semiconductor package has been proposed (Japanese Published Unexamined Patent Application No. HEI 10-79362, U.S. patent application No. 09/029,608). This semiconductor package has a structure that an external output terminal formed by a bump electrode on a chip is provided in order to have the shape of a semiconductor device to follow a semiconductor element (hereinafter referred to as chip) as much as possible, wherein the side surface of at least a bump electrode is resin-sealed in the wafer condition and thereafter such wafer is cut to each chip.

On the occasion of testing this semiconductor device, a more effective testing can be realized by conducting the test at a time in the wafer condition, in place of individually conducting the testing for each CSP after the cutting. It is also true in the wafer where a plurality of ordinary chips are formed. The present invention relates to the testing method of a probe card and a semiconductor device to conduct the testing to each chip in the wafer condition where a plurality of chips and CSPs are formed.

FIG. 1 to FIG. 3 illustrate an example of a CSP in the related art. FIG. 1 is a cross-sectional view thereof, FIG. 2 illustrates the condition of the CSP of FIG. 1 before it is cut into individual CSPs and FIG. 3 is a plan view of FIG. 2.

The CSP illustrated in FIG. 1 is covered with a silicon nitride film 2 at the area other than the aluminum pad 4 on the chip 1 and moreover a polyimide layer 3 is also formed thereon. The aluminum electrode pad 4 formed on the chip is too narrow for a prober to make contact during the testing time under this arrangement and it is also a problem that mounting on the mounting substrate is impossible during the mounting process. Therefore, a re-wiring layer 5 is formed on the polyimide layer 3, and is extended to adequate positions on the chip and is then connected to a copper bump electrode 6 and an interval of the aluminum pad 4 is widened. For the mounting on the mounting substrate, a solder ball 8 is formed on the copper bump electrode 6 via a barrier metal layer 7.

At the time of manufacturing the CSP of FIG. 1, after the copper bump electrode 6 is formed on the wafer, a resin layer 9 is formed to seal at least the side surface of the copper bump electrode 6. Thereafter, a solder ball 8 is formed and the wafer is then cut into individual pieces along the dicing line 12 as illustrated in FIG. 2.

However, at the time of testing the CSP, testing efficiency becomes bad after the wafer is cut into individual chips. Therefore, it is requested to conduct the testing under the condition illustrated in FIG. 3 before the cutting process.

FIG. 3 illustrates the condition where the CSP is formed in the wafer condition and the wafer 11 is held by a tape 10. If it is attempted to apply the prober formed of the existing stylus to the electrode pad (not illustrated) of each chip, it is very difficult to apply the stylus because the pad interval is too narrow.

A method for testing the chip having a narrow pad interval is described as an example in the Japanese Published Unexamined Patent Application No. HEI 7-263504. In this method, a contact corresponding to the pad position of the chip is formed on the flexible sheet and it is then pushed to the pad of the chip with negative pressure to establish the contact.

However, the above reference HEI 7-263504 has a problem illustrated in FIG. 4 as the problem which has not yet been recognized.

When the method introduced in the above reference is tried to be applied to the testing of a wafer condition, the wafer testing is conducted utilizing a probe card where a contact electrode is formed, at the position corresponding to each chip on the wafer 11, on the contact board 13. When the contact board 13 is closely in contact with the wafer 11 by applying a negative pressure during the testing, a problem arises that the solder ball 8a at the end part is placed in contact with the contact board but the contact board is floated at the area of solder ball 8b in the central area, losing contact condition thereof.

Moreover, also generated is a problem that the balls at the end part are deformed more easily when the solder balls at the end part are pressed.

In addition, it is generated as a problem that since the contact board is pulled with unequal forces, the sheet is elongated at the local areas.

Moreover, due to the difference of thermal expansion coefficient of the wafer and the sheet, both electrode positions are deviated to a large extent as it goes to the end part and thereby a problem of contact failure may be generated between the center and end part of the sheet.

In addition, the signal leads must be extended to the external side from the electrode of the contact board but there exists a fear for breakdown of the signal lead because the sheet becomes wavy.

The above problems are generally generated not only during the testing of the CSP in the wafer condition but also during the testing of the wafer where a plurality of chips are formed in the wafer condition.

BRIEF SUMMARY OF THE INVENTION

Therefore, it is an object of the present invention to provide a testing probe card for a semiconductor device, which can always assure an excellent contact condition between electrodes of each chip or electrode pads of a CSP on the occasion of testing a chip or a CSP in the wafer condition.

It is a further object of the present invention to solve the problem that contact failure may be generated between the center and end part of the sheet where both electrode positions are deviated to a large extent as it goes to the end part and thereby due to the difference of thermal expansion coefficient of the wafer and sheet.

It is a further object of the present invention to solve the problem that there exists a fear for breakdown of a signal lead because the sheet becomes wavy where the signal leads are extended to the external side from the electrode of the contact board.

It is further object of the present invention to provide a test method of a semiconductor device under circumstances of the excellent contact condition between electrodes of each chip or electrode pads of each CSP on the occasion of testing a chip or a CSP in the wafer condition.

Objects of the invention are achieved by a probe card for testing a plurality of semiconductor devices on a wafer comprising a contact board having a flexibility, a plurality of groups of contact electrodes provided on the contact board, a rigid base having openings exposing the groups of the contact electrodes on the contact board, and a wiring connecting to a predetermined contact electrode.

In the present invention described above, the probe card operates such that the rigidity of the probe card as a whole is maintained by a rigid base and flexibility is given to the contact electrode on the contact board in the area corresponding to the aperture.

Moreover, since the contact board within the aperture is flexible, if heights of bumps on the wafer fluctuate a little, fluctuation of bumps are absorbed by the flexible contact board and thereby contact failure is never generated. In addition, since the rigid base is formed like a lattice, it moves more easily in the thickness direction of the wafer than the plate type one having no aperture and the contact failure due to uneven bump height is difficult to occur from this viewpoint.

Further, since respective contact electrodes on the contact board corresponding to each chip are isolated due to the existence of the rigid base, distortion resulting from mismatching of thermal expansion coefficients of the wafer and the contact board is never accumulated in the periphery of the wafer as positional displacement to the contact electrode in the neighboring area and thereby contact in the same condition can be realized in any position on the wafer.

Further objects of the invention are achieved by a test method of a plurality of semiconductor devices on a wafer comprising the steps of preparing a probe card including a contact board having a flexibility, a plurality of groups of contact electrodes provided on the contact board, a rigid base having openings exposing the groups of the contact electrodes on the contact board and a wiring connecting to a predetermined contact electrode, contacting the contact electrode and an electrode on the semiconductor device by adhering the contact electrode to the wafer and testing the semiconductor devices via the wiring.

In the present invention described above, the semiconductor device testing method provides the operation that since the probe card used has an aperture and the contact board in the aperture is flexible, even if a height of bumps on the wafer is a little fluctuated, such fluctuation of bumps can be absorbed by the flexible contact board and the wafer can be tested without generation of contact failure. In addition, since the rigid base is formed in the shape of a lattice, it can move more easily in the thickness direction of wafer than the plate type having no aperture and contact failure due to uneven bump height is difficult to occur even in this viewpoint.

Further, since respective contact electrodes on the contact board corresponding to each chip are isolated due to existence of a rigid base, distortion resulting from mismatching of thermal expansion coefficients of the wafer and contact board is never accumulated in the periphery of the wafer as positional displacement to the contact electrode in the neighboring area and thereby contact in the same condition for wafer testing can be realized in any position on the wafer.

BRIEF DESCRIPTION OF THE DRAWINGS

These and other objects and advantages of the invention will become apparent and more readily appreciated from the following description of the preferred embodiments, taken in conjunction with the accompanying drawings of which

DETAILED DESCRIPTION OF THE PREFERRED EMBODIMENTS

Figure 1:
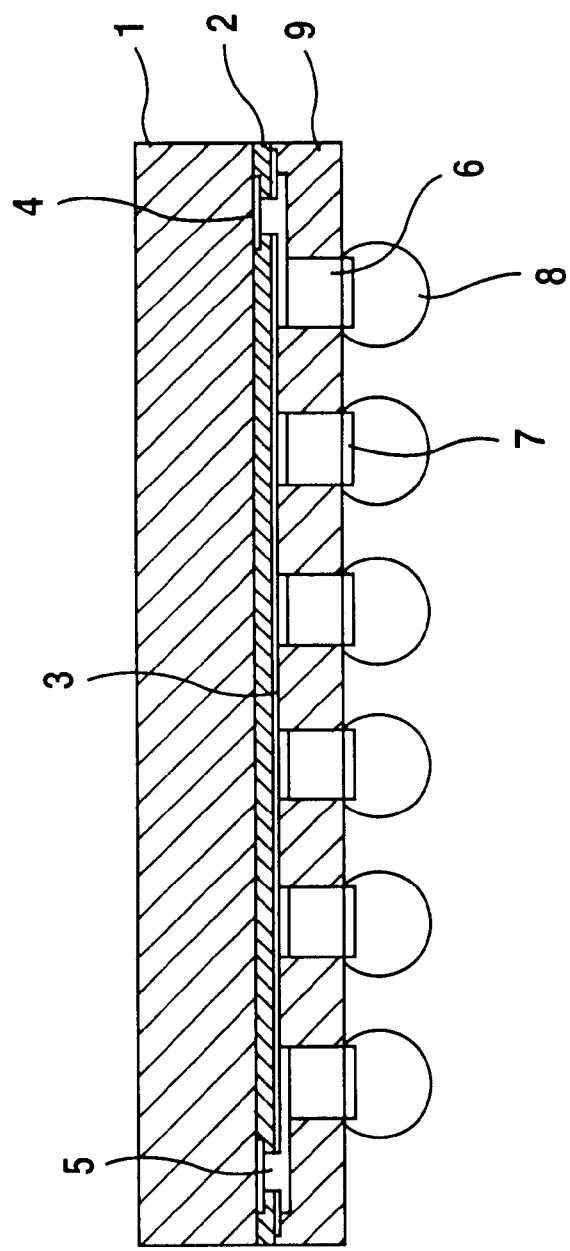
FIG. 1 is a diagram showing a structure of the CSP as the test object.
Figure 2:
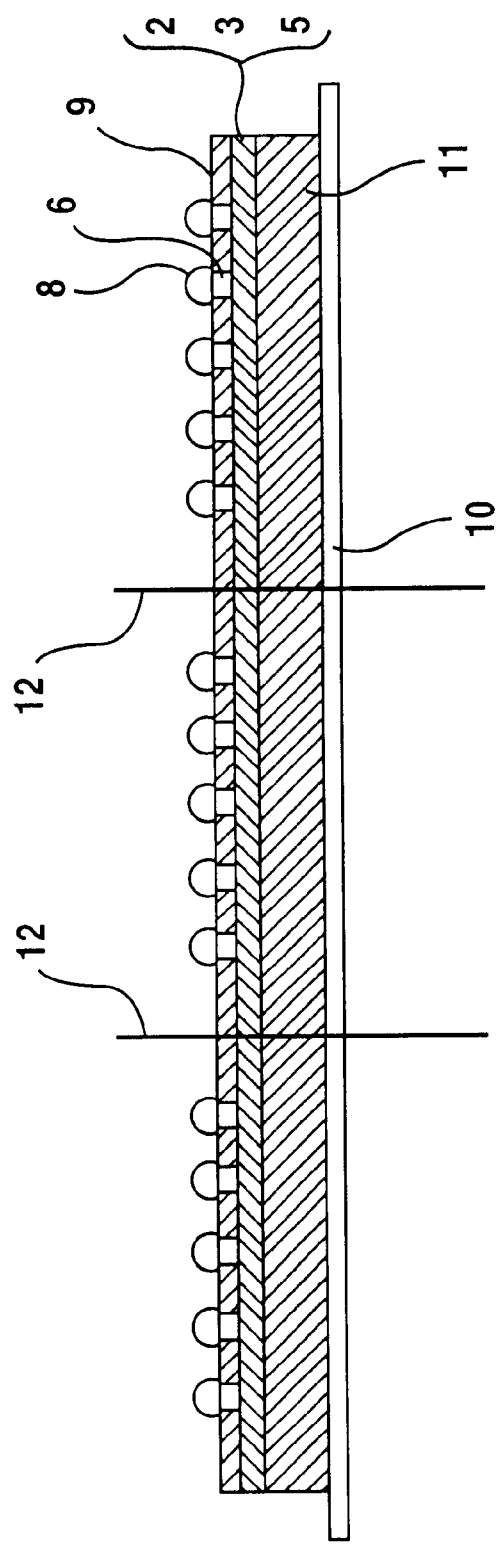
FIG. 2 is a diagram showing a cross-sectional view for explaining the CSP in the wafer condition as the test object.
Figure 3:
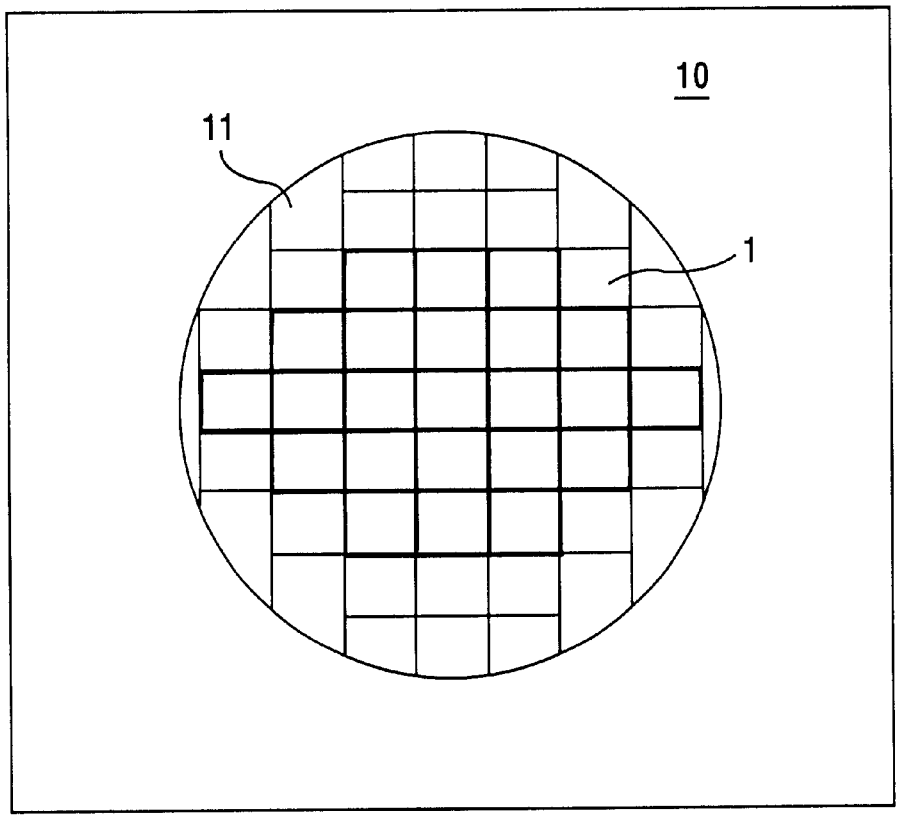
FIG. 3 is a diagram showing a plan view for explaining the CSP in the wafer condition as the test object.
Figure 4:
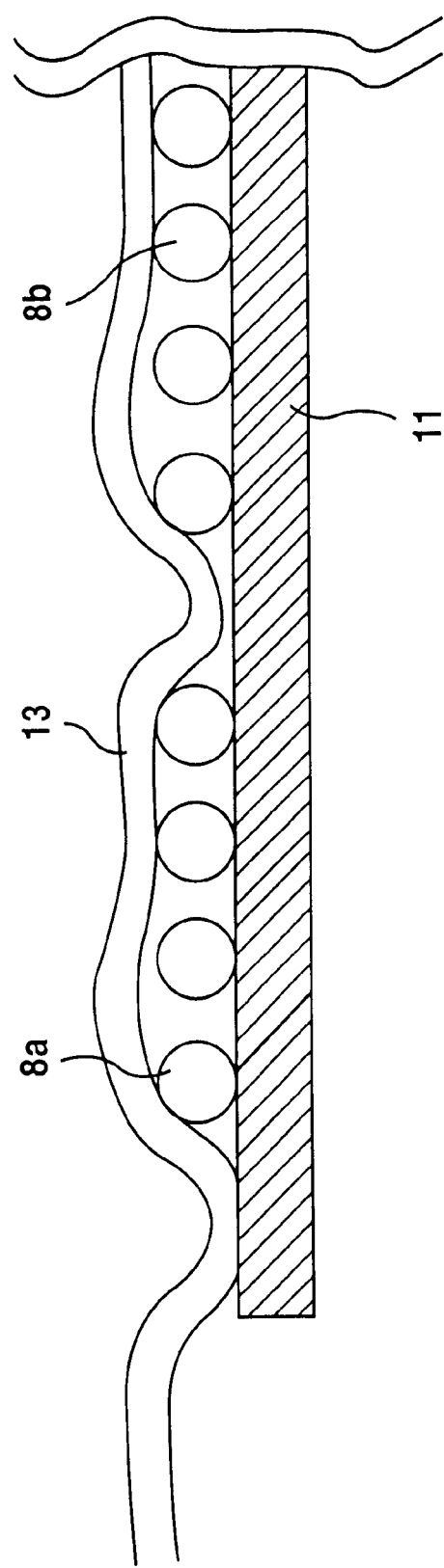
FIG. 4 is a diagram illustrating problems when the method of reference HEI 7-263504 is applied to the test in the wafer condition.

Reference will now be made in detail to the preferred embodiments of the present invention, examples of which are illustrated in the accompanying drawing, wherein like reference numerals refer to like elements throughout.

Preferred embodiments of the probe card and semiconductor device testing method of the present invention will be explained with reference to FIG. 5 to FIG. 29.

First Embodiment

Figure 5:
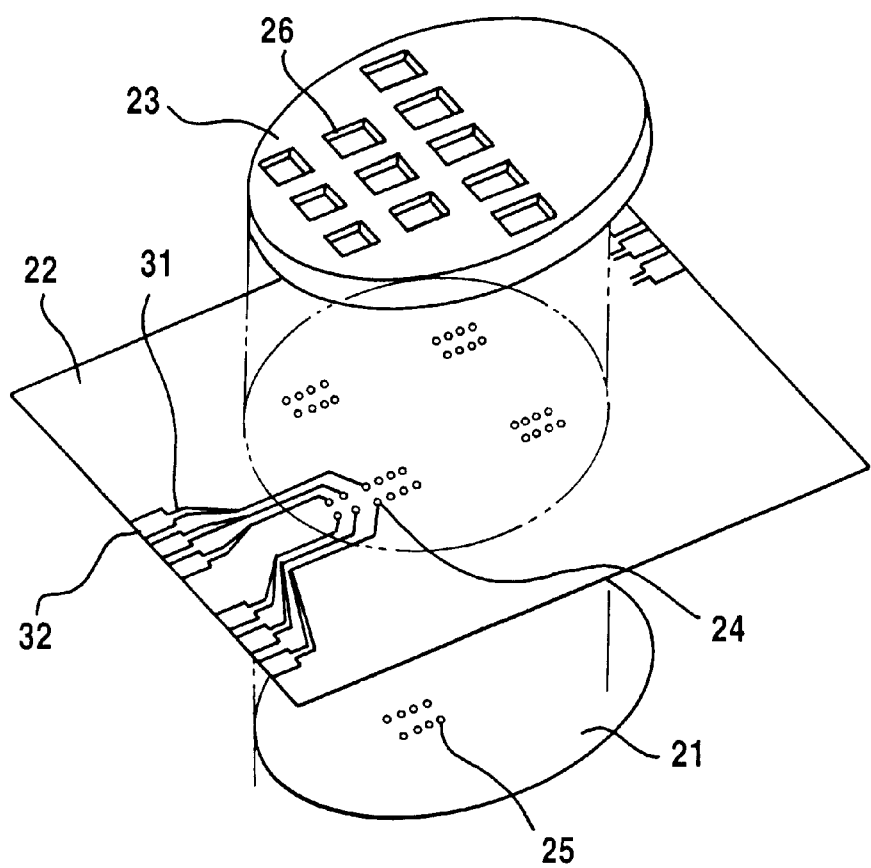
FIG. 5 is a diagram showing a disassembled perspective view of the first embodiment of the present invention.
Figure 6A:
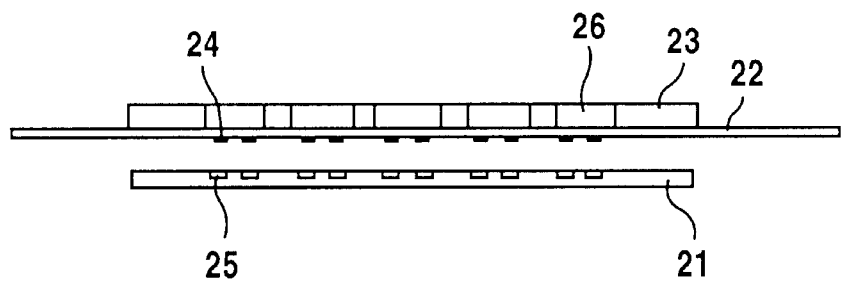
FIG. 6 is a diagram showing a side view and plan view of the probe card of the present invention.

FIG. 5 to FIG. 20 illustrate the first embodiment of the present invention. FIG. 5 is a disassembled perspective view of the probe card as the first embodiment. FIG. 6(a) is a side view of FIG. 5 and FIG. 6(b) is a plan view of the contact board 22 described later observed from the electrode forming surface.

In the figure, numeral 21 designates a semiconductor wafer on which a plurality of CSPs or ordinary chips are formed. The CSP or chip (hereinafter referred to as chip) formed on the wafer 21 has an electrode 25 and a bump 25a (refer to FIG. 7) is formed thereon and this bump is used as the external terminal because it is mounted on the substrate after the wafer is cut to respective pieces.

Numeral 22 designates the contact board on which the contact electrode 24 is formed for electrical connection with the electrode 25 of each chip and this contact board is formed of polyimide and silicon rubber or the like. This contact board has a thickness of 25 to 50 µm and a thermal expansion coefficient of about 10 to 1000 and it is required to have a certain degree of flexibility for application of stress. The size of the contact board is different depending on the size of wafer to be tested but is set to about 400 to 500×400 to 500 mm when the wafer size is 8 inches.

Figure 6B:
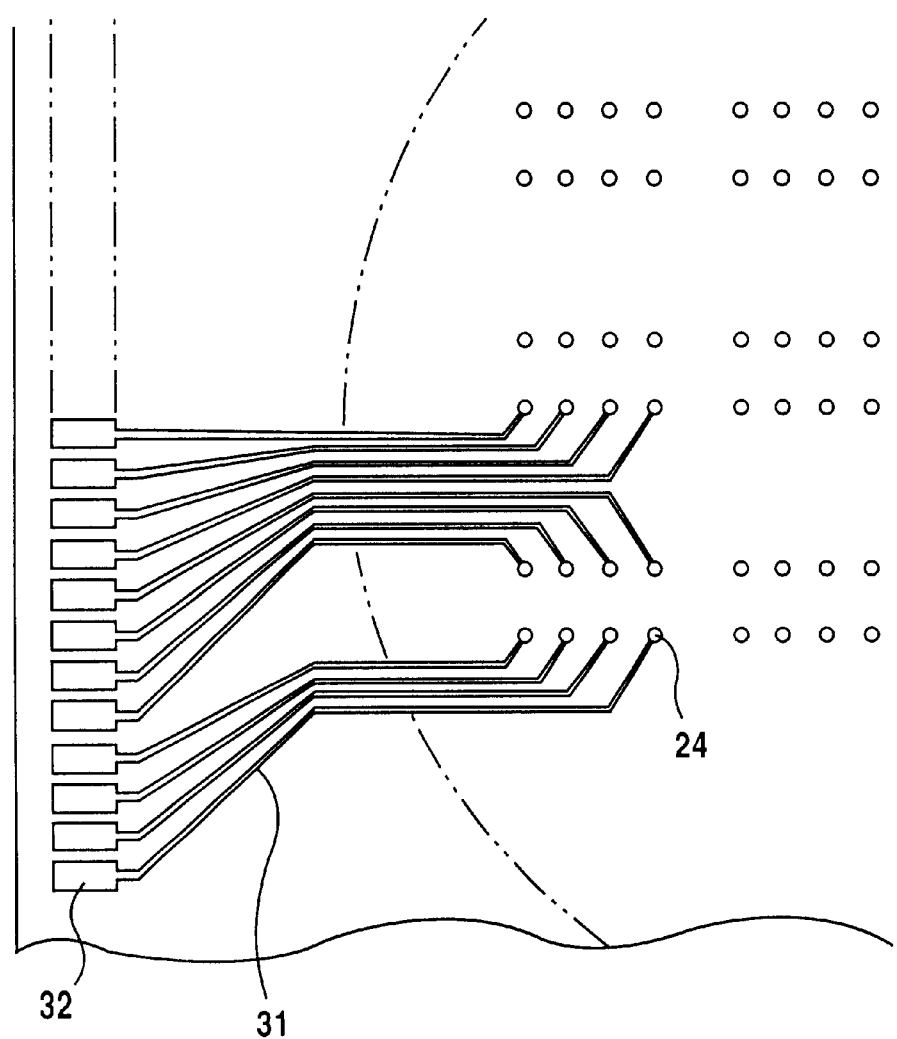

As illustrated in FIG. 6(b), the contact electrode 24 is formed corresponding to a layout of each chip electrode 25 on the wafer 21 to form the electrode group. Each contact electrode 24 is guided to the end part of the contact board 22 by the wiring 31 and is connected to the external connecting terminal 32 formed widely at the peripheral part. The wiring 31 is extended toward the external side of the wafer corresponding to the area indicated by a chain line and the interval of wiring 31 is sufficiently widened at the end part of the contact board. Connection to the testing board to be explained later may be realized with the widely formed external connecting terminal 32.

Numeral 23 designates a rigid base formed by ceramics provided on the contact board 22 in the thickness of 3 to 5 mm and having a thermal expansion coefficient of 3.5 ppm. The diameter changes in the range from 200 mm(8 inches) to 300 mm depending on the wafer to be tested and is set identical to or larger than the wafer when it is 8 inches.

As the rigid base, silicon, glass or the like is suitable, from the requirement of thermal expansion coefficient, when the wafer to be tested is a bare wafer. When the wafer to be tested is a wafer level CSP, printed circuit boards of glass epoxy and rolled steel plate are preferable. This rigid base 23 is provided at the position corresponding to the dicing line at the area between the electrode groups of the contact electrode 24 formed on the contact board 22 and has an aperture 26 to expose the contact board 22 at the area where the contact electrode 24 is formed. In FIG. 6(a), the rigid base 23 is formed on the contact board of the surface opposed to the surface where the contact electrode 24 is formed. This condition also corresponds to the condition where the rigid base is provided on the contact board between the contact electrode groups and the aperture to expose the contact board in the area where the contact electrode is formed.

The rigid base 23 is fixed to the contact board 22 by a thermosetting bonding agent of epoxy system or a pin. As is illustrated in the figure, the rigid base 23 covers the position corresponding to the dicing line as the area other than the chip forming area and therefore the rigid base 26 is formed like a lattice. The aperture 26 is located at the position corresponding to each chip on the wafer. Moreover, the size of aperture 26 is a little larger than the chip area.

A semiconductor wafer 21 allows, at its surface, formation of electronic circuits on a plurality of chips by the well known wafer process and the burn-in test and function test are conducted for the wafers before chips are delivered. In order to conduct such tests to the wafer before it is cut into respective chip pieces, a certain means is required for connection to the electrode of each chip formed on the wafer. In this embodiment, such means is realized by a probe card structured by the contact board 22 having the rigid base 23.

Owing to this structure, rigidity of the probe card as a whole can be maintained by the rigid base 23, and the contact board 22 forming the contact electrode at the area corresponding to the aperture 26 is given the flexibility. The contact board is fixed by the rigid base at the area corresponding to the dicing area of the wafer and since influence of thermal expansion is never transferred to the neighboring chip areas, material of the contact board can be selected from a wide range of materials having the thermal expansion coefficient of 10 to 1000.

In the present invention, the wafers where a bare wafer or CSP is formed in the wafer level or those where both are formed can be thought as the object of the wafer to be tested. These wafers are considered as wafer.

The process for conducting the test to each chip (each CSP in the case of wafer level CSP) formed on the wafer will be explained.

First, through the alignment of electrode 25 on the chip and contact electrode 24, the contact board 22 is laid and fixed on the wafer 21 to be tested after the end of wafer process. The fixing method will be explained later.

Next, a test signal is supplied to the wiring 31 on the contact board 22 and each chip on the wafer 21 is tested. In the case of burn-in test, a wafer is tested in the high temperature and high humidity condition.

Figure 7:
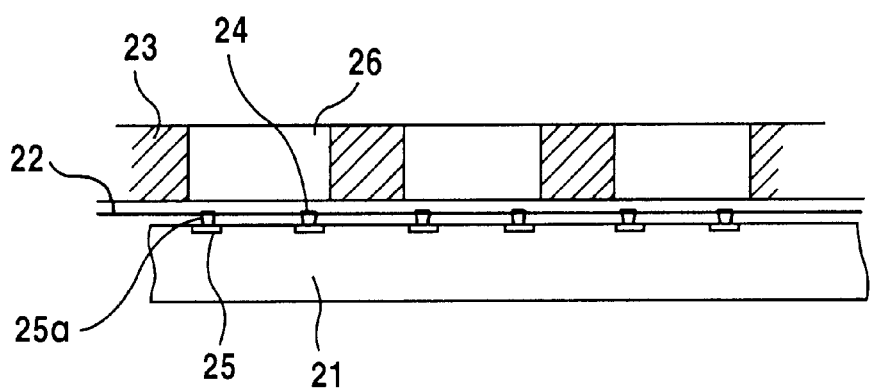
FIG. 7 is a diagram showing a cross-sectional view of the condition where the contact board is in contact with the wafer.
Figure 8:
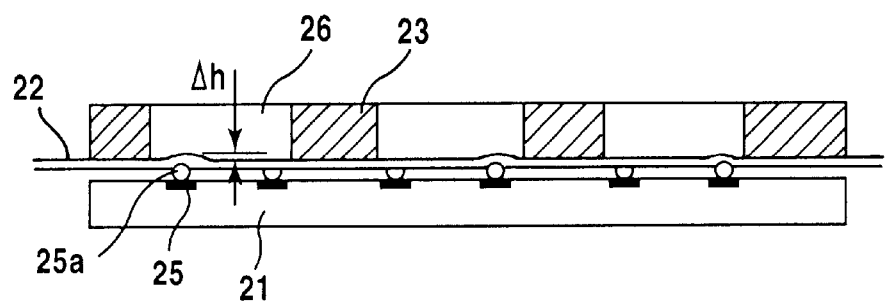
FIG. 8 is a diagram illustrating an effect of the first embodiment of the present Invention.

FIG. 7 illustrates a condition in which the testing is conducted while the wafer 21 is placed in contact with the contact board 22. The bump 25a on each chip is in contact with the contact electrode 24 provided on the contact board 22 and this contact electrode 24 is located on the contact board in the aperture 26 of the rigid base 23. With this structure, since the contact board in the aperture 23 is flexible, even if the height of bumps 25a on the wafer 21 are a little fluctuated, fluctuation (h) of the height of the bump is absorbed by the flexible contact board as illustrated in FIG. 8 and thereby contact failure is never generated.

Flexibility of the contact board in the present invention means that when the electrode and bump on the wafer to be tested are in contact with the electrode of the contact board as explained above, the contact board can move a certain degree in the vertical and lateral directions to absorb the displacement of position of the bump.

Moreover, since the rigid base 23 is formed in the shape of a lattice, movement in the thickness direction of wafer can be realized more easily than the plate type having no aperture. Accordingly, contact failure due to uneven bump height is difficult to occur in this point of view. When the thickness of the rigid base is small, movement in the thickness direction becomes large and when it is large, such movement becomes small on the contrary and therefore thickness can be set to the value as required.

Figure 9:
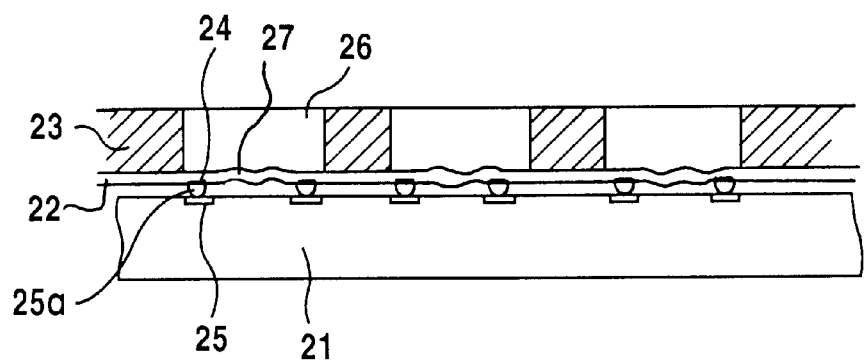
FIG. 9 is a diagram illustrating an effect of the first embodiment of the present invention.

In addition, respective contact electrodes 24 on the contact board corresponding to each chip are isolated by the rigid base 23. Owing to this structure, distortion 27 resulting from mismatching of thermal expansion coefficient of the wafer 21 and contact board 22 is never accumulated as the positional displacement in the contact electrode of the neighboring area at the periphery of the wafer 21 as illustrated in FIG. 9 and thereby contact may be realized in the same condition anywhere on the wafer. If positional displacement occurs only in one chip area, any problem is not generated because the positional displacement is only about 5 mm×10 ppm×100° C.=about 5 $\mu$m when the chip size is 100 mm square (in the case of burn-in test at 25° C. to 125° C.).

Moreover, since the rigid base 23 fixes the contact board for each chip area, the contact board is in contact with the wafer, and the contact board is never extended at the local area or does not become wavy and thereby the fear for breakdown of wiring can be eliminated.

In the test conducted under a high temperature like the burn-in test, it is desirable that the thermal expansion coefficient of wafer 21 and contact board 22 is matched with each other, but it is difficult to form the wafer 21, contact board 22 and rigid base 23 with the material having the equal thermal expansion coefficient because the functions to be requested are different respectively. Therefore, when the thermal expansion coefficient of rigid base 23 is set to the value nearer to the value of wafer 21 than the contact board 22, since the contact board 22 can be deflected to a certain degree by its flexibility as is explained previously, the rigid base 23 is expanded or compressed in the same degree as the wafer 21 and thereby positional displacement between the center area of wafer 21 and electrode 25 of each chip at the periphery and contact electrode 24 can be minimized.

Moreover, when the rigid base 23 is formed by silicon, the rigid base having the equal thermal expansion coefficient to that of the wafer to be tested may be obtained. The rigid base can be formed by the similar process technique as the semiconductor device manufacturing process.

When the wafer to be tested has the external terminal in such a size as considerably larger than the chip electrode of bare wafer like the wafer level CSP, since the positional displacement by thermal expansion coefficient is not so severe, the rigid base may be formed by a metal material such as steel, stainless steel or the like.

Figure 10:
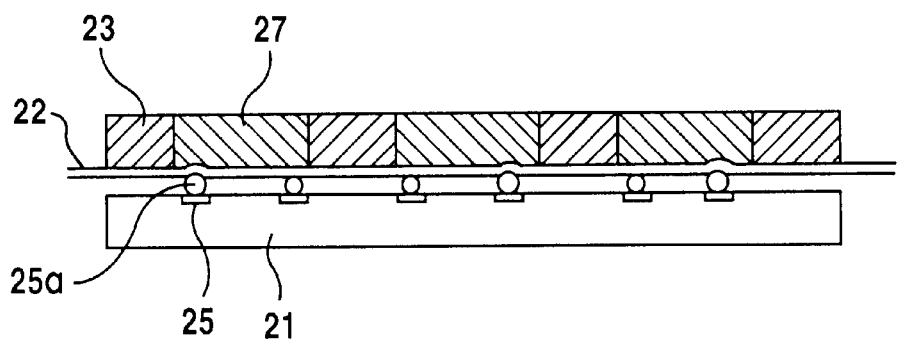
FIG. 10 is a diagram illustrating a modification example of the first embodiment of the present invention.

FIG. 10 illustrates a modification example of the present embodiment. As illustrated in the figure, the aperture of rigid base 23 is engaged with a block body 27 formed by an elastic material such as silicon rubber or the like. When the wafer to be tested has a large number of pins, allowing the total pressure in the contact condition to become large, a problem arises that the tension of the contact board itself cannot support such pressure and the contact board is deformed. In such a case, while strength of the contact board is reinforced by using the block body 27, the contact board can maintain its flexibility and all electrodes of the wafer to be tested can surely be in contact with the electrode of the contact board.

Moreover, when the block body 27 is a little projected from the rigid base 23, centralized contact pressure can be applied to the electrodes of the wafer to be tested by giving pressure to the projected part.

Figure 11:
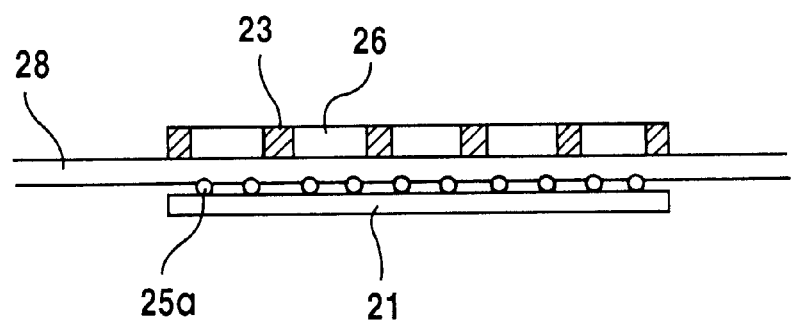
FIG. 11 is a diagram illustrating a modification example of the first embodiment of the present invention.

FIG. 11 illustrates another modification example of the present embodiment. In this embodiment, a rubber sheet 28 is used as the contact board. Owing to this structure, more soft contact between the bump 25a formed on the wafer 21 and the contact electrode can be realized in comparison with the sheet type contact board of polyimide or the like.

Figure 12:
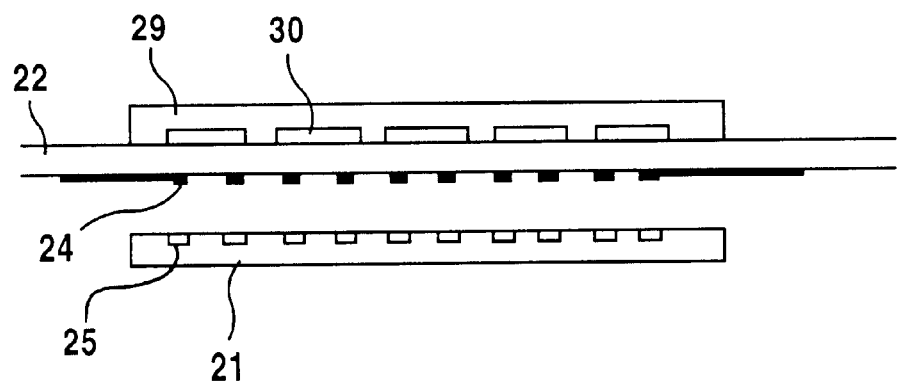
FIG. 12 is a diagram illustrating a modification example of the first embodiment of the present invention.

FIG. 12 illustrates another modification example of the present embodiment. In this modification, as the aperture of the rigid base, a space 30 is provided to the rigid base 29 at the corresponding position of each chip. Since the contact electrode 24 of the contact board 22 is provided at the position corresponding to this space, flexibility of the contact board by the aperture 26 explained above can be obtained by this space 30 and since the rigid base 29 is integrated as a whole, high rigidity can be assured as the probe card.

Figure 13:
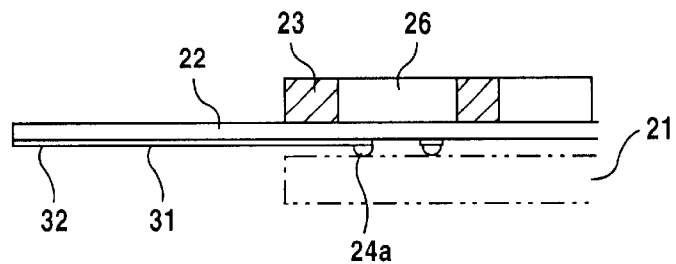
FIG. 13 is a diagram illustrating a modification example of the first embodiment of the present invention.
Figure 14:
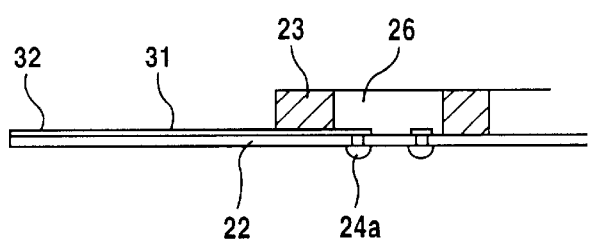
FIG. 14 is a diagram illustrating a modification example of the first embodiment of the present invention.

FIG. 13 and FIG. 14 illustrate modification examples of the 141 present embodiment of the contact electrode and wiring provided on the contact board. In FIG. 13, the bump electrode 24a such as a bump or the like is formed on the contact electrode and it is then in contact with the electrode on the wafer 21. This structure provides the effect that the wafer level testing can be conducted to the bare wafer where the bump electrode such as a bump or the like is not formed on the wafer.

In FIG. 14, the wiring 31 and external connecting terminal 32 are provided in the side of rigid base 23 of the contact board 22. This structure results in the effect that short-circuit of the chip electrode and contact board wiring formed on the wafer to be tested can be prevented.

Figure 15:
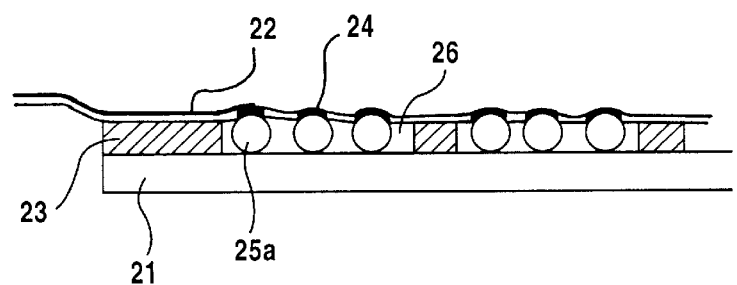
FIG. 15 is a diagram illustrating a modification example of the first embodiment of the present invention.

FIG. 15 illustrates a modification example of the position where the rigid base 23 is provided. As illustrated in the figure, the rigid base 26 is provided on the contact board between the contact electrode groups, it is attached on the contact board 22 in the same side as the contact electrode and is located between the contact board 22 and wafer 21. The thickness of the rigid base 23 has to be thinner than the bump 25a on the wafer 21. The aperture 26 is formed between the contact board 22 and wafer 21 but flexibility of the contact board at the aperture is similar to that in the condition of FIG. 7 as explained above. The rigid base 23 is located on the dicing line between chips and therefore any damage is applied to the chips. Since the rigid base is located between the contact board and wafer, it can be prevented that excessive pressure is applied to the wafer to be tested.

Figure 16:
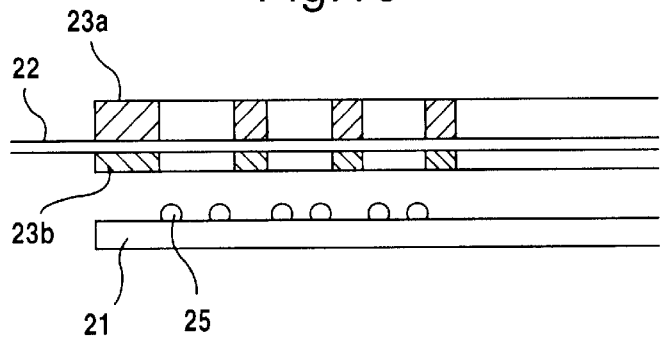
FIG. 16 is a diagram illustrating a modification example of the first embodiment of the present invention.

FIG. 16 also illustrates a modification example of the position where the rigid base 23 is provided. As is illustrated in the figure, a couple of rigid bases 23a and 23b are provided in both surfaces of the contact board. This structure results in the effect that since the rigid base 23b acquires the function as the spacer between the contact board and wafer to be tested and the rigid base 23a acquires the function to compensate for difference between the rigidity of contact board and thermal expansion coefficient thereof, respective functions may be set in optimum with the rigid bases provided at the upper and lower sides of the contact board.

Next, connection of wafer 21, contact board 22 and rigid base 23 will be explained.

Figure 17:
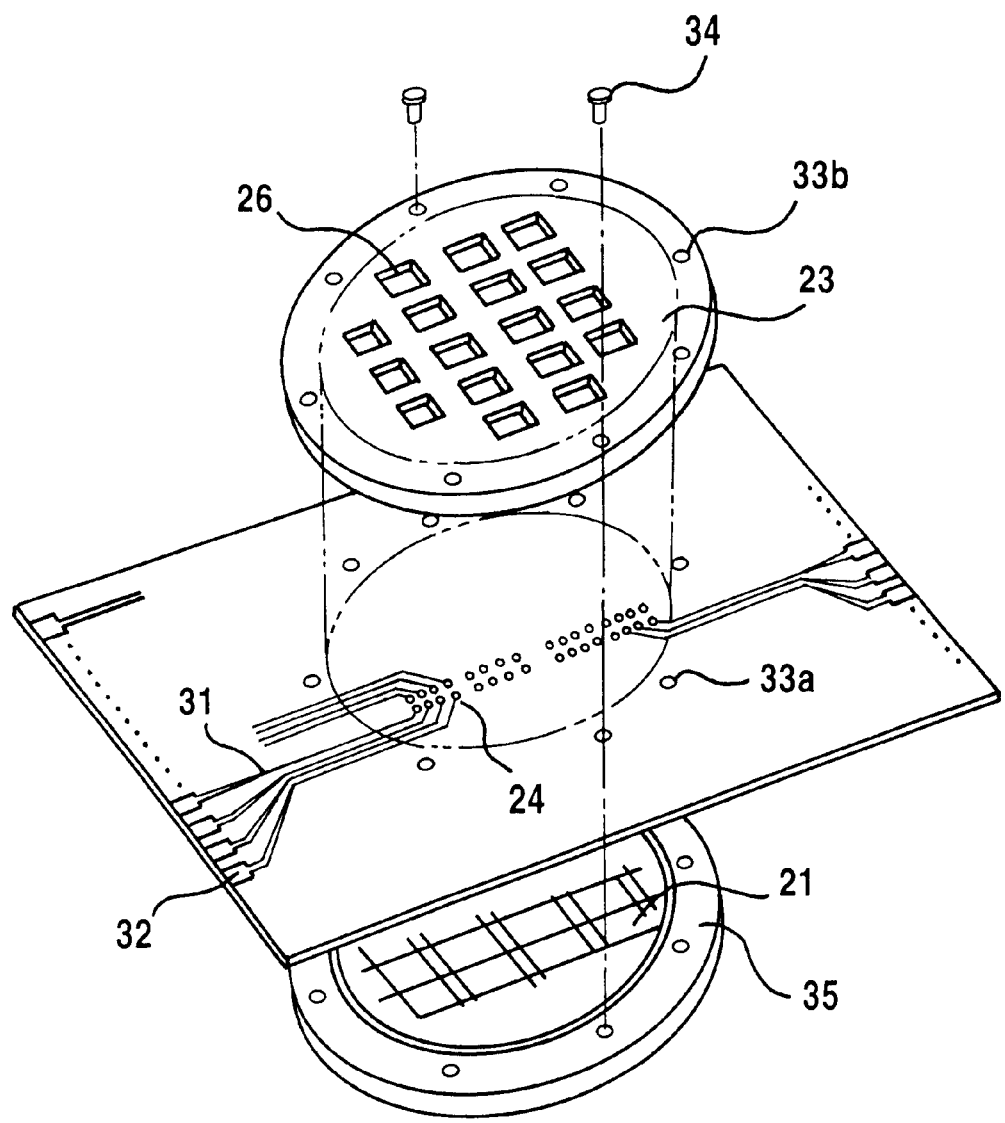
FIG. 17 is a diagram for explaining a rigid base, contact board and wafer fixing method of the present invention.
Figure 18:
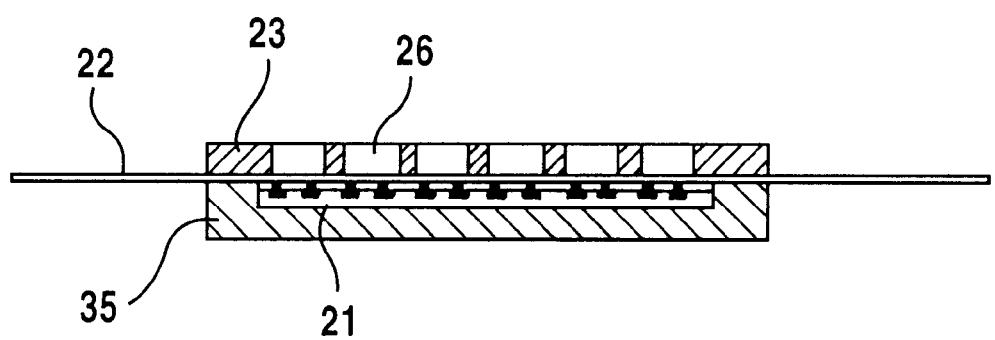
FIG. 18 is a diagram illustrating the cross-sectional view of FIG. 17.

FIG. 17 is a disassembled perspective view when the wafer 21, contact board 22 and rigid base 23 are connected. FIG. 18 is a cross-sectional view of the condition that such three parties are connected.

Hole 33a is provided around the area corresponding to the wafer 21 of the contact board 22 and the wafer holder 35 fixing the wafer 21 and hole 33b formed around the rigid base are placed in contact closely by tightening the wafer 21, contact board 22 and rigid base 23 with a screw 34.

As illustrated in FIG. 17, the external connecting terminal 32 provided at the peripheral part of the contact board may be kept in the flexible condition by fixing the rigid base 23 to the periphery of the area corresponding to the wafer 21. This structure provides the following effect.

Figure 19:
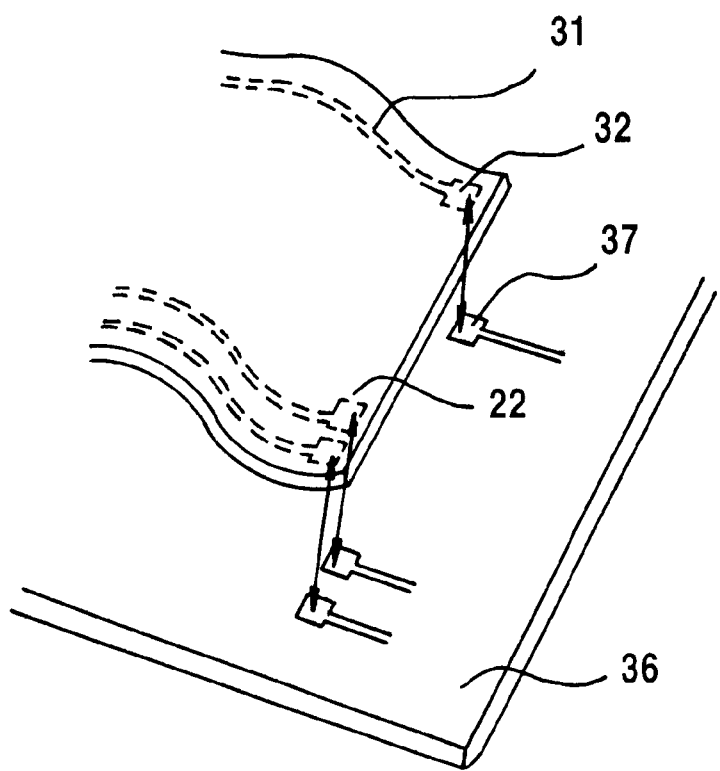
FIG. 19 is a diagram illustrating the condition where the contact board is mounted on the surface of a test board.
Figure 20:
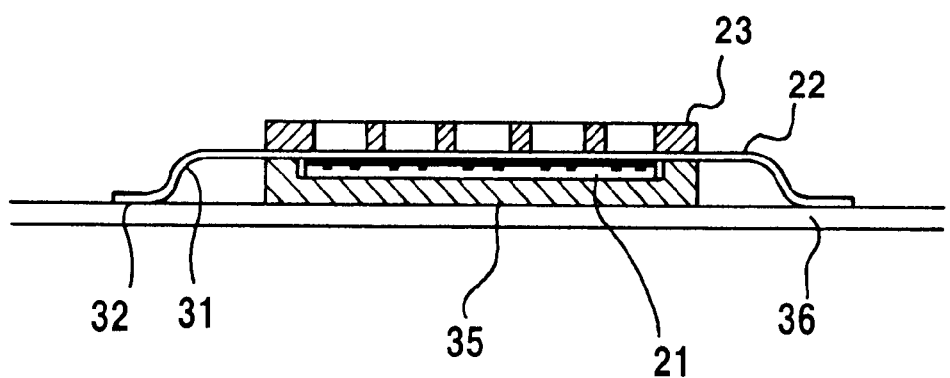
FIG. 20 is a diagram illustrating the cross-sectional view of FIG. 19.

FIG. 19 and FIG. 20 illustrates the effects. FIG. 19 is a perspective view of the condition that the external connecting terminal 32 at the periphery of the contact board is mounted at the surface of the terminal 37 of the test board 36 like the burn-in board. FIG. 20 is the cross-sectional view of this condition.

Usually, a test board is required to supply the signals required for the test for the burn-in test and function test. On this test board, a plurality of wafers are mounted for the test. In this case, when the contact board 22 and test board are connected via a connector, the cost rises by as much.

According to the structures of FIG. 19 and FIG. 20, since the external connecting terminal 32 provided at the peripheral part of the contact board is flexible, the external connecting, terminal 32 in the peripheral part of the contact board 22 can be mounted directly on the surface of the terminal of the test board 36 using solder and therefore cost can be lowered by as much as no use of a connector.

Second Embodiment

Figure 21:
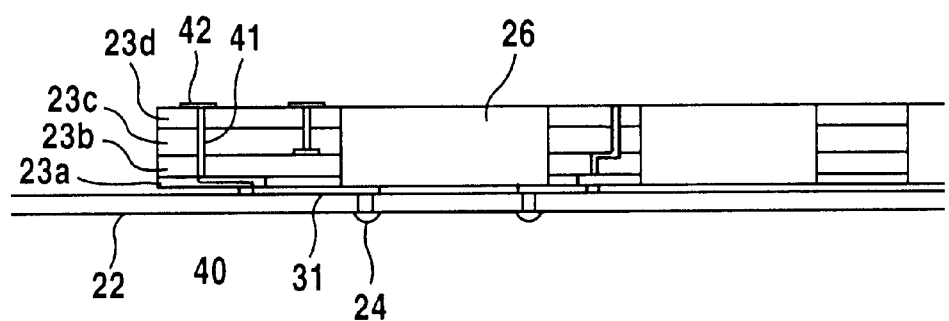
FIG. 21 is a diagram illustrating a second embodiment of the present invention.
Figure 22:
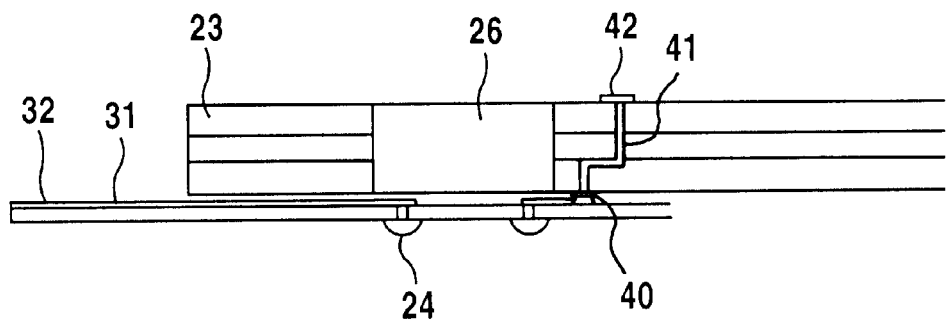
FIG. 22 is a diagram illustrating a second embodiment of the present invention.

FIG. 21 and FIG. 22 illustrate the second embodiment of the present invention.

Structure of the present embodiment is similar to the first embodiment explained above, except for the structure of the rigid base and therefore explanation about the elements other than the rigid base is omitted here.

The rigid base 23 of the present embodiment is formed of a plurality of layers as illustrated in FIG. 21. Each layer is formed, when the wafer to be tested is a bare wafer, of silicon, glass (thermal expansion coefficient: 0.5 to 9.0) or the like. When the wafer to be tested is a wafer level CSP, since the pitch of the solder ball 8 (refer to FIG. 1) is expanded more than the electrode pitch on the chip by the rewiring layer 5, the allowable degree for thermal expansion of the contact board is large and therefore a glass epoxy printed circuit board and a rolled steel plate or the like may be used as the material of the contact board. A copper wiring pattern is formed on the surface of each layer of the rigid base 23 and a via is provided as required to connect each layer. The copper wiring pattern and via can be formed by the ordinary printed circuit board manufacturing technology.

The lowest layer 23a is provided with an electrode 40 at the bottom surface and it is then connected with the wiring 31 on the contact board 22 at the corresponding position. At the surface of the lowest layer 23a in the opposite side of the electrode 40, a wiring layer is provided and it is connected to the via 41. The via 41 is provided through the intermediate layers 23b, 23c and reaches to the highest layer 23d. At the surface of highest layer 23d, an electrode 42 is provided and is then connected to the via 41. The electrode 42 is provided at the upper surface of the rigid base 23, corresponding to the external connecting terminal 32 of the contact board periphery of the first embodiment and is then connected to the test board.

This structure provides the effect that extension of wiring only with the contact board has been restricted but the signal can be extracted from the contact electrode 24 of the contact board 22 with the electrode 42 which is sufficiently widened at the surface of the rigid base 23.

Moreover, unlike the first embodiment, since the signal from the wafer can be extracted at the upper surface on the rigid base, the risk of the short-circuit between the electrode of the chip formed at the surface of the wafer to be tested and the wiring to extract the signal from the contact electrode can be prevented.

In addition, since the signal from the wafer is extracted at the upper surface of the rigid base 23, it is no longer required to extend the wiring to the end part of the contact board and the contact board may be formed in small size as is equal to or a little larger than the wafer to be tested.

In addition, since the power supply layer and ground layer are provided within a plurality of layers of the rigid base 23, such layers may be supplied by the wide wiring layers, considering the high speed testing.

In addition, the rigid base is formed of a silicon wafer and it is processed by the semiconductor wafer manufacturing process, and thereby the wiring layer having the function similar to that of the printed circuit board explained above and via can be manufactured with higher accuracy.

An example that the rigid layer 23 is formed of four layers is illustrated in FIG. 21, but the number of layers is not limited to four layers and it is also allowed to use the single layer. When the wiring is not so much extended, the rigid base may be formed of single layer and the effect similar to that when a plurality of layers are used can also be attained by providing the electrode at the upper part of the rigid base.

FIG. 22 illustrates a modification example of the second embodiment. In this example, the rigid base is formed of a plurality of layers and the external connecting terminal 32 is also provided at the peripheral part of the contact board 22.

The rigid base 23 is formed of a plurality of layers like that illustrated in FIG. 21 and the signal from the contact electrode 24 is guided to the electrode 42 provided at the highest layer. Moreover, the signal of the contact electrode 24 is guided to the external connecting terminal via the wiring 31 toward the end part of the contact board 22.

Even when the number of contact electrodes 24 increases, the electrode 42 and external connecting terminal 32 can be formed with a sufficient interval by guiding the signal from the wafer to the electrode 42 at the surface of rigid base 23 and external connecting terminal 32 at the peripheral part of the contact board 22.

Third Embodiment

Figure 23:
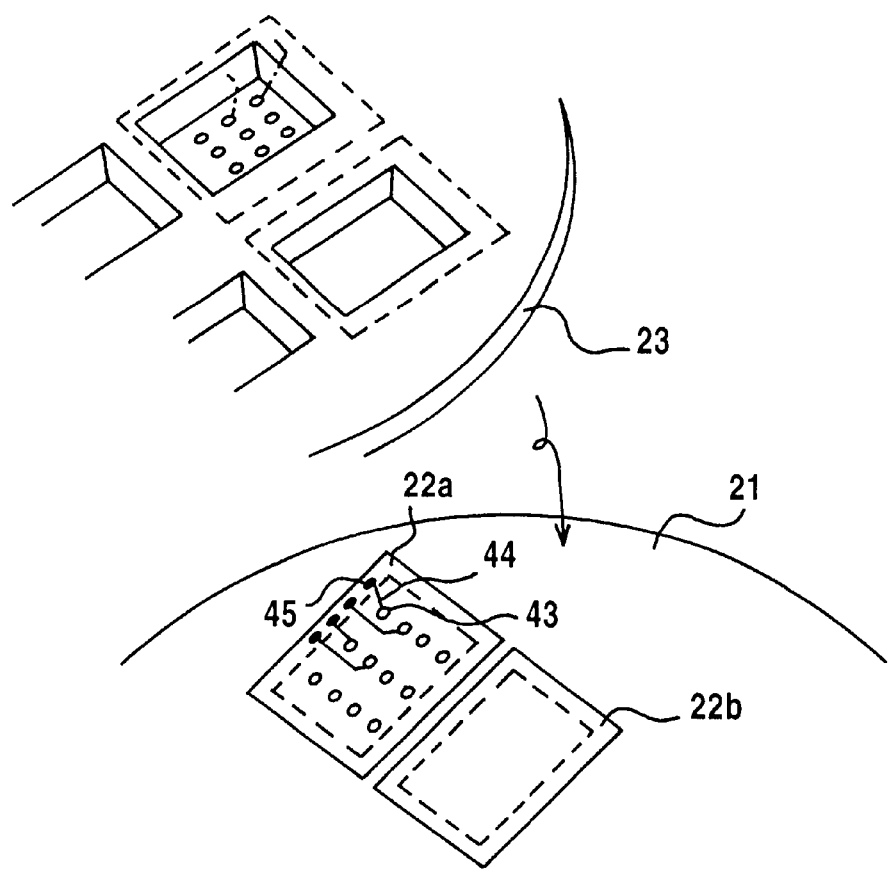
FIG. 23 is a diagram illustrating a third embodiment of the present invention.
Figure 24:
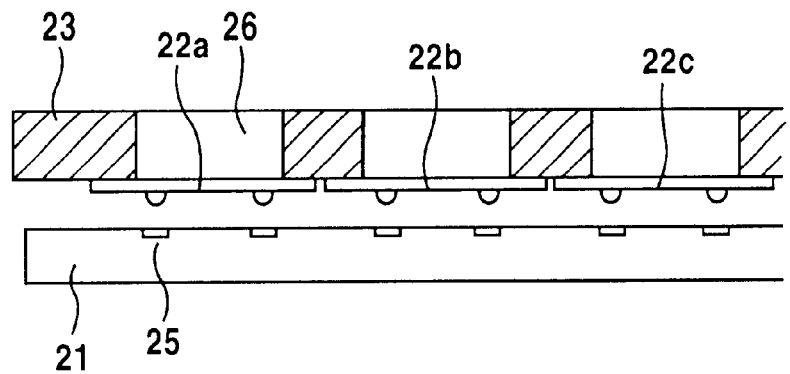
FIG. 24 is a diagram illustrating the cross-sectional view of FIG. 23.
Figure 25:
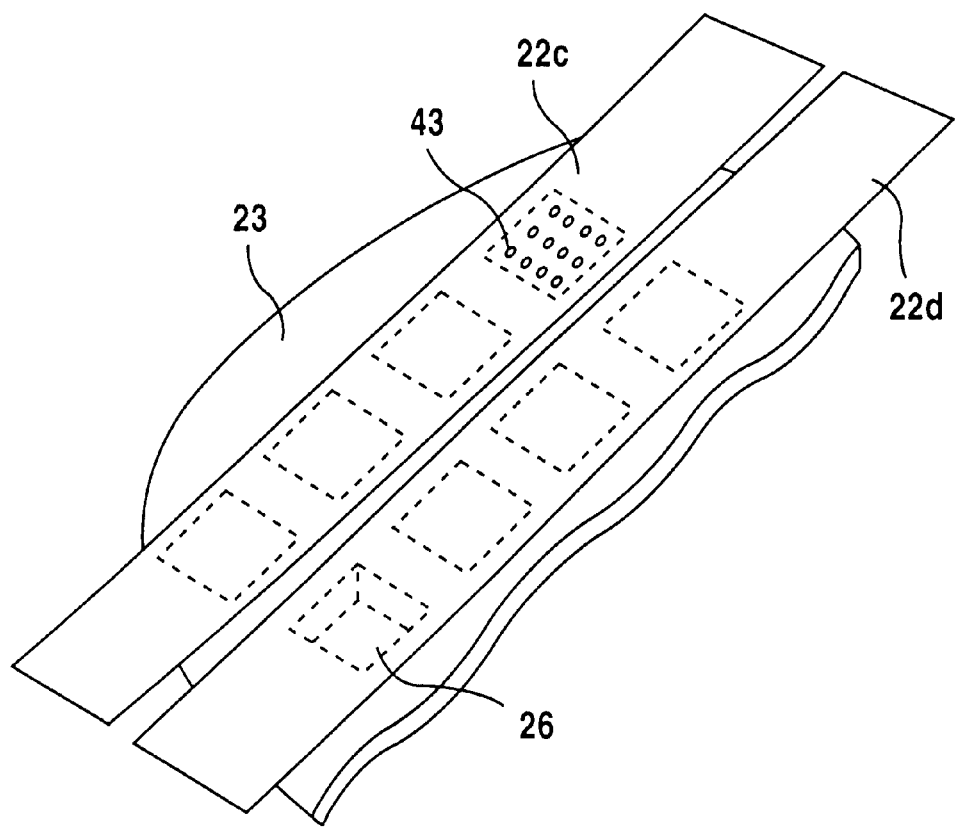
FIG. 25 is a diagram illustrating a modification example of the third embodiment of the present invention.

FIG. 23 to FIG. 25 illustrate the third embodiment of the present invention.

The structure of the present embodiment is similar to that of the first embodiment explained above, except for the structure of the contact board. Therefore, explanation of the other elements is omitted here.

The contact boards 22a to 22c of the present embodiment are set to the size corresponding to the chip to be tested as illustrated in the figure and are a little larger than the chip. Each contact board 22a to 22c allows formation of contact electrode 43 at the respective surface thereof and each contact electrode 43 is connected with the wiring 44 and is then guided to the periphery of the contact board 22a and is also connected to the electrode 45.

The aperture 26 of the rigid base 23 is located and has the size corresponding to the chip area and is provided to expose the contact board in the area where the contact electrode 43 is formed.

Since the contact board is provided for each aperture as explained above, if a failure occurs at a part of the contact electrode 43, wiring 44 and electrode 45, the probe card can be repaired easily only by exchanging the contact board of the relevant area.

FIG. 25 is a modification example of the present embodiment. The contact board 22d is provided like a narrow and elongated rectangular shape for each aperture 26 of a line corresponding to a line of the chip of the wafer to be tested. This structure provides the effect that repair can be made easily as explained above and the wiring from the contact electrode may be extended to the end part of the contact board explained above.

Fourth Embodiment

Figure 26:
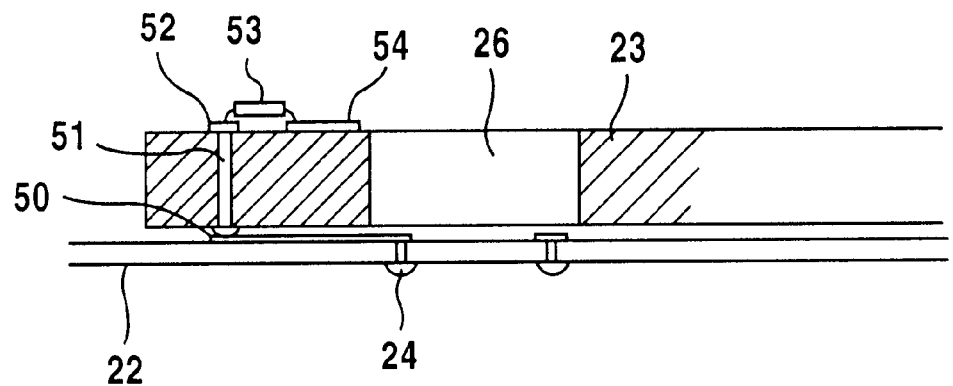
FIG. 26 is a diagram illustrating a fourth embodiment of the present invention.
Figure 27:
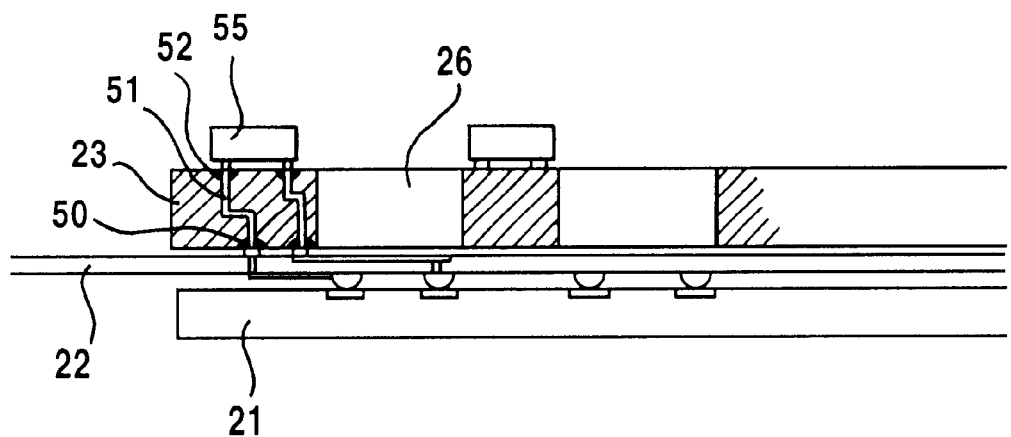
FIG. 27 is a diagram illustrating a modification example of the fourth embodiment of the present invention.

FIG. 26 and FIG. 27 illustrate the fourth embodiment of the present invention.

The structure of the present embodiment is similar to that of the first to third embodiments, except for the point that an excessive current limiting element such as a fuse and a resistor or the like and a test circuit are provided on the surface of rigid base. The explanation of the other portions is omitted here.

FIG. 26 illustrates the condition where a fuse 53 is provided at the surface of rigid base 23. The rigid base is formed of a plurality of layers (not illustrated) as explained in the second embodiment and the signal from the wafer is connected to the contact board at the electrode 50 of the lowest layer and is also guided to the electrode 52 of the highest layer through the via hole 51. The highest layer of the rigid base 23 has allowance in its area and any problem is never generated for layout of the electrode 54 even when a fuse is provided.

One end of the fuse 53 is connected to the electrode 52, while the other end thereof to the electrode 54. The electrode 54 is connected to the test board for testing of the wafer. The fuse blows to suspend the supply of the power source in such a manner as not giving any influence on the good chips when a chip fails in view of protecting the good chips.

Even when a resistor is provided in place of the fuse, similar effect can also be attained by limiting an over current to the good chips if a chip fails.

Moreover, when the rigid base is formed by processing the silicon wafer, an element such as a fuse or a resistor can be formed on the wafer by the known process.

Here, the rigid base is formed of a plurality of layers in this embodiment but it may also be formed of a single layer.

FIG. 27 illustrates the condition where a test circuit chip 55 is mounted at the surface of rigid base 23. The rigid base 23 is formed of a plurality of layers (not illustrated) as in the case of FIG. 26 and the signal from the wafer is connected to the contact board with the electrode 50 of the lowest layer and is then guided to the electrode 52 at the upper surface of the rigid base 25 through the via hole 51.

One end of the test circuit chip 55 is connected to the electrode of chip as the test object through the electrode 50, via 51 and electrode 52, while the other end is connected to the other electrode of the chip as the test object with the other path illustrated in the figure.

A certain chip comprises therein the test circuit for the test by itself. However, in this case, there is a problem that the chip area is sacrificed by as much as the test circuit. Therefore, as illustrated in FIG. 27, it is no longer required to provide the test circuit in the chip as the test object, namely in the chip as a product by providing the test circuit chip to the surface of the rigid base 23 and thereby the chip size can be reduced by as much as the surface area of the test circuit.

Moreover, when the rigid base is formed by processing the silicon wafer, the test circuit chip can be formed on the wafer by the well known wafer process.

A method of fixing the probe card and wafer using negative pressure among those explained in each embodiment will then be explained with reference to FIG. 28 and FIG. 29.

Figure 28:
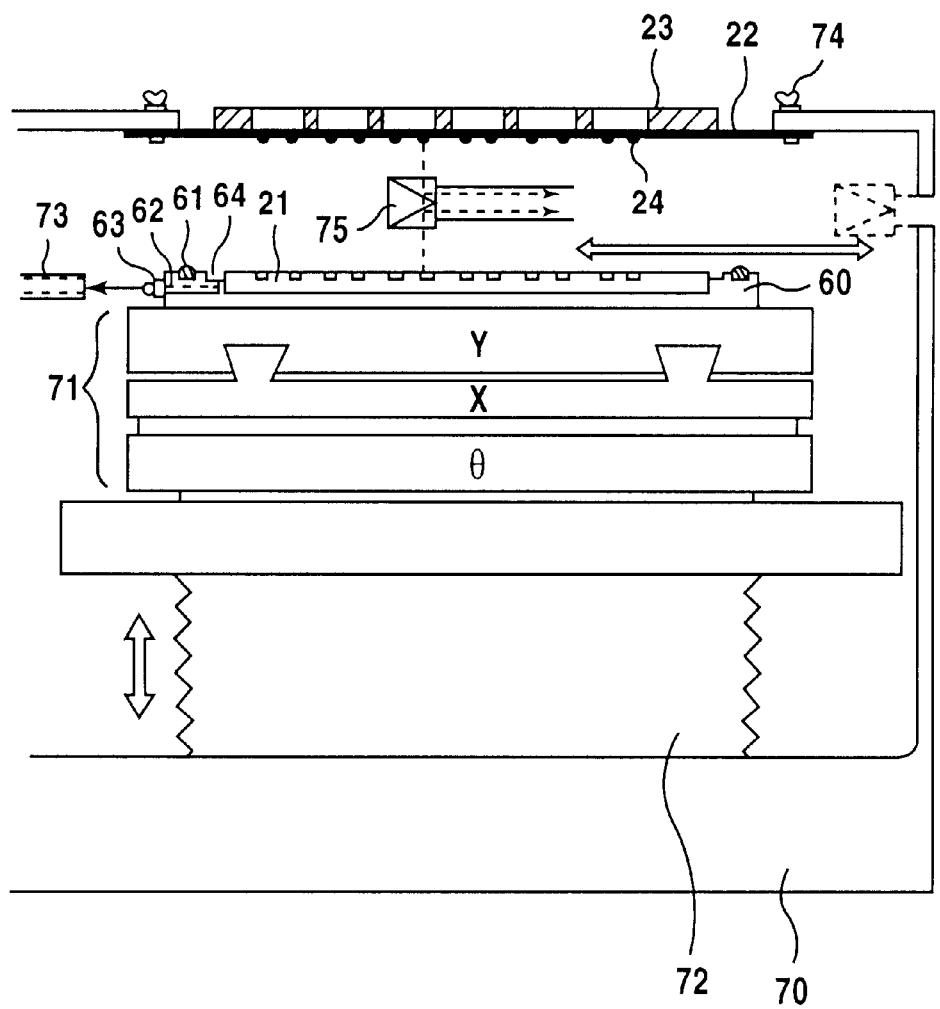
FIG. 28 is a diagram illustrating a mechanism for positioning the probe card and contact board of the present invention.

FIG. 28 is a side view of the positioning apparatus 70 for fixing the wafer 21 and probe card (22, 23) through the positioning. In this figure, 71 designates stages for adjusting the positions of X, Y, of wafer and 72 designates a lifting mechanism for vertically moving these stages.

The process for fixing the wafer 21 and probe card mounts first the wafer holder 60 holding the wafer 21 on the X, Y, tables.

Next, the end part of the contact board is fixed to the positioning apparatus 70 with a temporary fixing means 74, the position of the wafer 21 is adjusted as required in its height by the lifting mechanism 72 and is also fine-adjusted by the X, Y, tables for the purpose of the positioning of the electrode of each chip of the wafer 21 and the contact electrode 24. In this case, fine positioning of both the wafer and the contact electrode is performed by the image recognition apparatus 75.

Next, the lifting mechanism 72 is moved upward to place the wafer 21 in close contact with the contact board 22. Under this condition, the wafer 21 and contact board are intensively placed in contact with each other by applying a negative pressure. The negative pressure is supplied from a vacuum generator 73 and is then guided to the wafer holder via a valve 63 provided at the side surface of the wafer holder 60. The valve is communicated with a cavity 64 loading the wafer in the wafer holder via a vacuum path 62 and the negative pressure supplied from a vacuum generator 73 gives negative pressure to the cavity 64.

Figure 29:
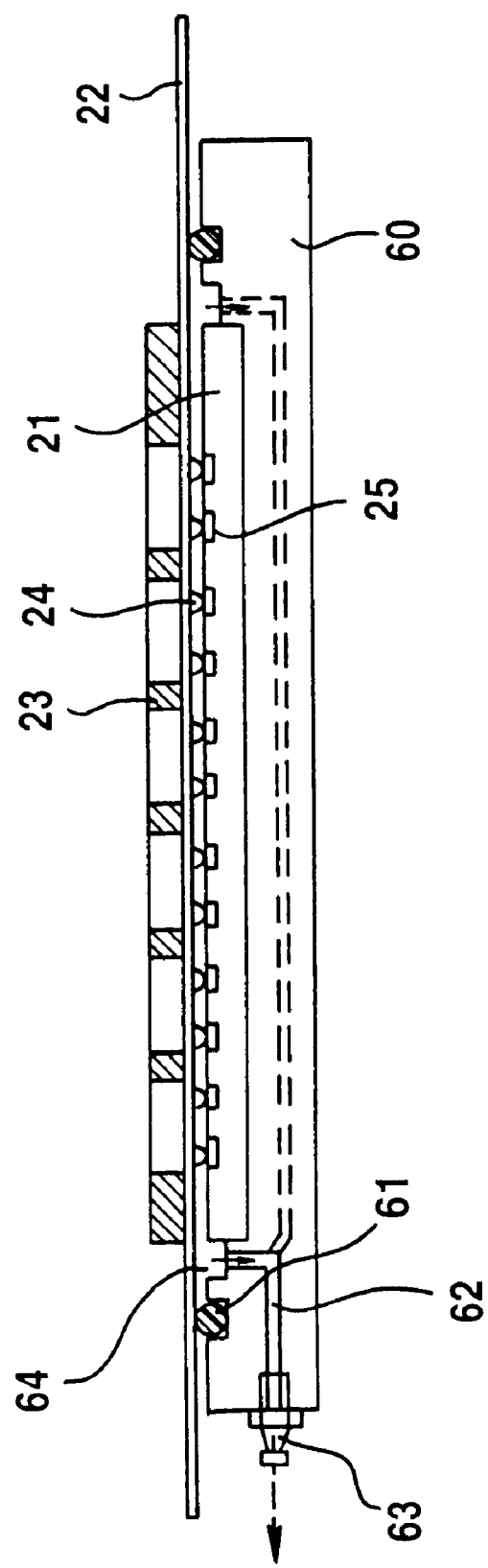
FIG. 29 is a diagram showing an enlarged cross-sectional view of the essential portion of FIG. 28.

FIG. 29 is an enlarged view illustrating the condition that the cavity 64 is filled with negative pressure. When the cavity 64 is in the negative pressure condition, the contact board 22 is attracted to the side of the wafer 21 and thereby each chip electrode 52 on the wafer 21 and the contact electrode 24 are closely in contact with each other to attain the electrical continuity. Even when the valve 63 is closed, negative pressure in the cavity 64 is maintained by the seal 61 to keep close contact between the wafer and contact board. Thereafter, even if the contact board 22 fixed by the temporary fixing means is isolated, close contact may be kept between the contact board and wafer.

If contact pressure between the contact board and wafer to be tested is insufficient, mechanical pressure is added to the negative pressure attained by evacuation to compensate for the contact pressure. More practically, pressure is compensated by mechanically fixing the wafer, contact board and rigid base with a screw 34 using the method illustrated in FIG. 17.

Moreover, the positioning apparatus 70 explained in regard to FIG. 28 arranges the image recognition apparatus 75 between the contact board 22 and wafer to be tested 21, but it is also possible to provide the image recognition apparatus at the upper part of the contact board for the positioning between the contact electrode 24 and the electrode of the wafer 21 through the contact board. Thereby, positioning of both elements can be realized only with a single camera.

FIG. 28 and FIG. 29 illustrate the positioning between the contact board and wafer, however, as illustrated in FIG. 19 and FIG. 20, the wafer may be tested by the positioning between that where the contact board is mounted at the surface of the test board and the wafer.

As explained above, the probe card of the present invention can provide a highly reliable semiconductor device testing method which always assures a good contact condition between each chip and electrode pad of CSP on the occasion of testing a chip and CSP in the wafer condition.

The present invention has been explained with reference to the preferred embodiments thereof, but the present invention is not limited to the embodiments explained above and various modifications and alterations may be made within the scope of the claims.

Although several preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A probe card for testing a plurality of semiconductor devices on a wafer comprising:
    a contact board having a flexibility;
    a plurality of groups of contact electrodes provided on the contact board,
    a rigid base having apertures exposing the groups of the contact electrodes on the contact board, said rigid base provided on a side of the contact board opposite a side having the contact electrodes, wherein the rigid base is formed by a single layer or multiple layers, having a first electrode connected to the wiring on the lower surface of the rigid base and a second electrode connected to the first electrode on an upper surface of the rigid base; and
    a wiring connecting to a predetermined contact electrode.

2. A probe card as claimed in claim 1, wherein a thermal expansion coefficient of the rigid base is the same as silicon or closer to silicon than the contact board.

3. A probe card as claimed in claim 1, wherein the contact board is made of a polyimide or rubber sheet.

4. A probe card as claimed in claim 1, wherein the wiring is led to a peripheral portion of the contact board, connected to an external connecting terminal which is wider than the wiring.

5. A probe card as claimed in claim 1, wherein a bump electrode is provided on the contact electrode.

6. A probe card claimed in claim 1, wherein the rigid base is made of a printed circuit board or silicon wafer.

7. A probe card claimed in claim 1, wherein an over current limiting element or test circuit chip is provided on the upper surface of the rigid base, connected to the second electrode.

8. A probe card for testing a plurality of semiconductor devices on a wafer comprising:
    a contact board having a size corresponding to a size of the semiconductor device, having a flexibility,
    a plurality of groups of contact electrodes provided on the contact board,
    a rigid base having apertures exposing the groups of the contact electrodes on the contact board, wherein the rigid base is formed by a single layer or multiple layers, having a first electrode connected to the wiring on the lower surface of the rigid base and a second electrode connected to the first electrode on an upper surface of the rigid base; and
    a wiring connecting to a predetermined contact electrode.

9. A test method of a plurality of semiconductor devices on a wafer comprising the steps of:
    preparing a probe card including
        a contact board having a flexibility, a plurality of groups of contact electrodes provided on the contact board, a rigid base having apertures exposing the groups of the contact electrodes on the contact board and a wiring connecting to a predetermined contact electrode;
    contacting the contact electrode and an electrode on the semiconductor device by adhering the contact electrode to the wafer, and testing the semiconductor devices via the wiring;
    securing the rigid base by a first member, securing the wafer by a second member and then securing the contact board between the first and second member;
    surface mounting an external connecting terminal provided on a peripheral portion of the contact board to a test board.

10. A test method of a plurality of semiconductor devices as claimed in claim 9, wherein the contact electrode and the wafer are adhered by negative pressure when the contact electrode and the electrode on the semiconductor device are contacted.

11. A test method of a plurality of semiconductor devices as claimed in claim 9, wherein a thermal expansion coefficient of the rigid base is the same as silicon or closer to silicon than the contact board.

12. A test method of a plurality of semiconductor devices as claimed in claim 9, wherein a size of the contact board is corresponding to a size of the semiconductor device.

13. A test method of a plurality of semiconductor devices as claimed in claim 9, wherein a bump electrode is provided on the semiconductor device, at least a side surface of the bump electrode is encapsulated by a resin comprising further step of:
    testing the wafer provided the semiconductor device having the bump electrode.

14. A probe card for testing a plurality of semiconductor devices on a wafer comprising:
    a flexible contact board;
    a plurality of contact electrodes provided on the contact board;
    at least one rigid base provided on at least one side of the contact board, said at least one rigid base having apertures corresponding to positions of the contact electrodes, wherein the rigid base is formed by a single layer or multiple layers, having a first electrode connected to the wiring on the lower surface of the rigid base and a second electrode connected to the first electrode on an upper surface of the rigid base; and
    wiring connecting the contact electrodes to respective external connecting terminals.

* * * * *